(12) United States Patent
Hatori

(10) Patent No.: US 12,322,923 B2
(45) Date of Patent: Jun. 3, 2025

(54) LASER APPARATUS

(71) Applicant: KYOCERA SOC Corporation, Yokohama (JP)

(72) Inventor: Masami Hatori, Yokohama (JP)

(73) Assignee: KYOCERA SOC Corporation, Yokohama (JP)

( * ) Notice: Subject to any disclaimer, the term of this patent is extended or adjusted under 35 U.S.C. 154(b) by 703 days.

(21) Appl. No.: 17/690,603

(22) Filed: Mar. 9, 2022

(65) Prior Publication Data

US 2022/0294173 A1    Sep. 15, 2022

(30) Foreign Application Priority Data

Mar. 11, 2021    (JP) ................. 2021-038910

(51) Int. Cl.
*H01S 3/04*    (2006.01)
*H01S 3/02*    (2006.01)
(Continued)

(52) U.S. Cl.
CPC ............ *H01S 3/1317* (2013.01); *H01S 3/025* (2013.01); *H01S 3/0401* (2013.01);
(Continued)

(58) Field of Classification Search
CPC ...... H01S 3/1317; H01S 3/025; H01S 3/0401; H01S 3/0405; H01S 3/09415;
(Continued)

(56) References Cited

U.S. PATENT DOCUMENTS 5,832,015 A  *  11/1998  Goto ................. H01S 3/025
                                                  372/75
6,614,966 B2     9/2003   Kitaoka et al.
(Continued)

FOREIGN PATENT DOCUMENTS

JP       09312440 A      12/1997
JP     2009312440 A      12/1997
(Continued)

OTHER PUBLICATIONS

Office Action for Japanese Patent Application No. 2021-038910 with English Translation.

*Primary Examiner* — Kinam Park
(74) *Attorney, Agent, or Firm* — Harter Secrest & Emery LLP; Timothy W. Menasco, Esq.

(57) ABSTRACT

Fluctuations in optical output are positively suppressed in a laser apparatus that adjusts the temperature of a housing that contains constituent components of a laser to be a predetermined temperature. Constituent components of a laser that include a resonator constituted by the back end surface of a laser diode and a resonator mirror are contained within a housing. The housing is bonded to a Peltier element via an adhesive layer. The Peltier element is driven based on detected temperatures within the housing to adjust the housing to be of a predetermined temperature. An adhesive layer in which a plurality of substantially uniformly shaped spacers that regulate the distance between the housing and the Peltier element are dispersed is employed as the adhesive layer.

9 Claims, 9 Drawing Sheets

(51) Int. Cl.
*H01S 3/0941* (2006.01)
*H01S 3/102* (2006.01)
*H01S 3/131* (2006.01)
*H01S 5/02208* (2021.01)
*H01S 5/024* (2006.01)
*H01S 5/14* (2006.01)
*H01S 3/042* (2006.01)
*H01S 3/0933* (2006.01)

(52) U.S. Cl.
CPC ........ H01S 3/0405 (2013.01); H01S 3/09415 (2013.01); H01S 3/1028 (2013.01); H01S 5/02208 (2013.01); H01S 5/02415 (2013.01); H01S 5/02438 (2013.01); H01S 5/141 (2013.01); *H01S 3/042* (2013.01); *H01S 3/0933* (2013.01); *H01S 5/14* (2013.01)

(58) Field of Classification Search
CPC ............... H01S 3/1028; H01S 5/02208; H01S 5/02415; H01S 5/02438; H01S 5/141; H01S 3/042; H01S 3/0933; H01S 5/14
See application file for complete search history.

(56) References Cited

U.S. PATENT DOCUMENTS

| | | | |
|---|---|---|---|
| 6,621,962 B2 | 9/2003 | Kitaoka et al. | |
| 2003/0012230 A1* | 1/2003 | Hopkins | H01S 5/141 |
| | | | 372/20 |
| 2007/0116082 A1* | 5/2007 | Feve | H01S 3/0627 |
| | | | 372/107 |
| 2010/0054289 A1* | 3/2010 | Hellstrom | H01S 3/025 |
| | | | 438/26 |
| 2017/0093127 A1* | 3/2017 | Kondo | H01S 5/14 |
| 2020/0119511 A1* | 4/2020 | Lochman | H01S 5/02476 |
| 2020/0169065 A1* | 5/2020 | Carson | H01S 5/18327 |

FOREIGN PATENT DOCUMENTS

| | | |
|---|---|---|
| JP | 2001070787 A | 3/2001 |
| JP | 2001196683 A | 7/2001 |
| JP | 2001332787 A | 11/2001 |
| JP | 2001337253 A | 12/2001 |
| JP | 201929428 A | 2/2019 |

* cited by examiner

LASER APPARATUS

CROSS-REFERENCE TO RELATED APPLICATIONS

This application is based on Japanese Patent Application No. 2021-038910, the contents of which are incorporated herein by reference.

BACKGROUND

The present disclosure is related to a laser apparatus. In greater detail, the present disclosure is related to a laser apparatus of a configuration in which constituent elements of a laser are contained within a housing, and the temperature of the housing is controlled.

Conventionally, as disclosed in Japanese Unexamined Patent Publication No. 2019-29428 (Patent Document 1), there are known external resonator type lasers, in which a light emitting element such as a laser diode is configured so as to not resonate on its own, and light emitted from the light emitting element is caused to oscillate by an external resonator. As disclosed in Japanese Unexamined Patent Publication No. 2001-332787 (Patent Document 2), there are known laser diode pumped solid state lasers, in which a solid state laser crystal is pumped by a laser beam emitted from a laser diode.

In the aforementioned external resonator type lasers and laser diode pumped solid state lasers, the lengths of resonators vary due to ambient temperatures, and optical output fluctuates as a result. Conventionally, various techniques have been proposed to prevent such fluctuations in optical output. For example, Patent Document 2 discloses a configuration in which constituent elements of the laser are contained within a housing, and the temperature of the housing is adjusted to be a predetermined temperature by a temperature adjusting element such as a Peltier element.

SUMMARY

A laser apparatus according to the present disclosure comprises:
- a housing, within which constituent components of a laser that include a resonator are contained; and
- a temperature adjusting element which is bonded to the housing via an adhesive layer;
- the temperature adjusting element being driven based on a detected temperature of the housing to adjust the temperature of the housing to be a predetermined temperature; and
- the adhesive layer being that in which a plurality of substantially uniformly shaped spacers that regulate a distance between the housing and the temperature adjusting element are dispersed.

As a specific aspect, spherical beads may be favorably employed as the spacers. In this case, it is desirable for the outer diameters of the beads to be within a range from 10 μn to 100 μm.

Cylindrical fibers may be employed as the spacers.

Spacers constituted by glass or a ceramic may be favorably employed as the spacers.

In the laser apparatus according to the present disclosure, an external resonator type laser or a laser diode pumped solid state laser may be applied as the laser to be contained in the housing. It is preferable for the laser to be contained in the housing to be that which includes a wavelength controlling element that causes laser oscillation wavelengths to become those within a narrow bandwidth.

The present inventors have discovered the reason why optical output fluctuates in conventional laser apparatuses which are configured to adjust the temperature of a housing, within which constituent components of a laser are contained, to be a predetermined temperature. The reason will be explained below. FIG. 8A is a schematic illustration of a conventional laser apparatus. In FIG. 8A, reference numeral 10 denotes a housing within which constituent components of a laser (not shown) are contained, and reference numeral 30 denotes a temperature adjusting element such as a Peltier element. The lower surface of the housing 10 in the drawing sheet and the upper surface (bonding surface) of the temperature adjusting element 30 in the drawing sheet are bonded via a thin adhesive layer, which is not illustrated. FIG. 8A illustrates a case in which ambient temperature is comparatively low, FIG. 8B illustrates a case in which ambient temperature is approximately the same as the temperature of the interior of the housing 10, and FIG. 8C illustrates a case in which ambient temperature is comparatively high.

In the case of FIG. 8A, the upper surface of the temperature adjusting element 30 is heated, resulting in the housing deforming so as to expand. In the case of FIG. 8C, the upper surface of the temperature adjusting element 30 is cooled, resulting in the housing deforming so as to contract. Conventionally, the adhesive layer that bonds the housing 10 and the temperature adjusting element 30 is formed to be comparatively thin in order to improve response properties to temperature adjustments. Therefore, deformation that occurs when the temperature control element 30 is driven is directly transferred to the housing 10, resulting in deformation of the housing 10. The present inventors found that length of the resonator which is contained within the housing changes due to this deformation, and optical output fluctuates as a result.

In the laser apparatus of the present disclosure, the adhesive layer in which a plurality of substantially uniformly shaped spacers that regulate a distance between the housing and the temperature adjusting element are dispersed is employed as the adhesive layer. Therefore, it is possible to form the adhesive layer to be comparatively thick, while enabling the thickness thereof to be controlled to be uniform.

DESCRIPTION OF THE EMBODIMENTS

Figure 1:
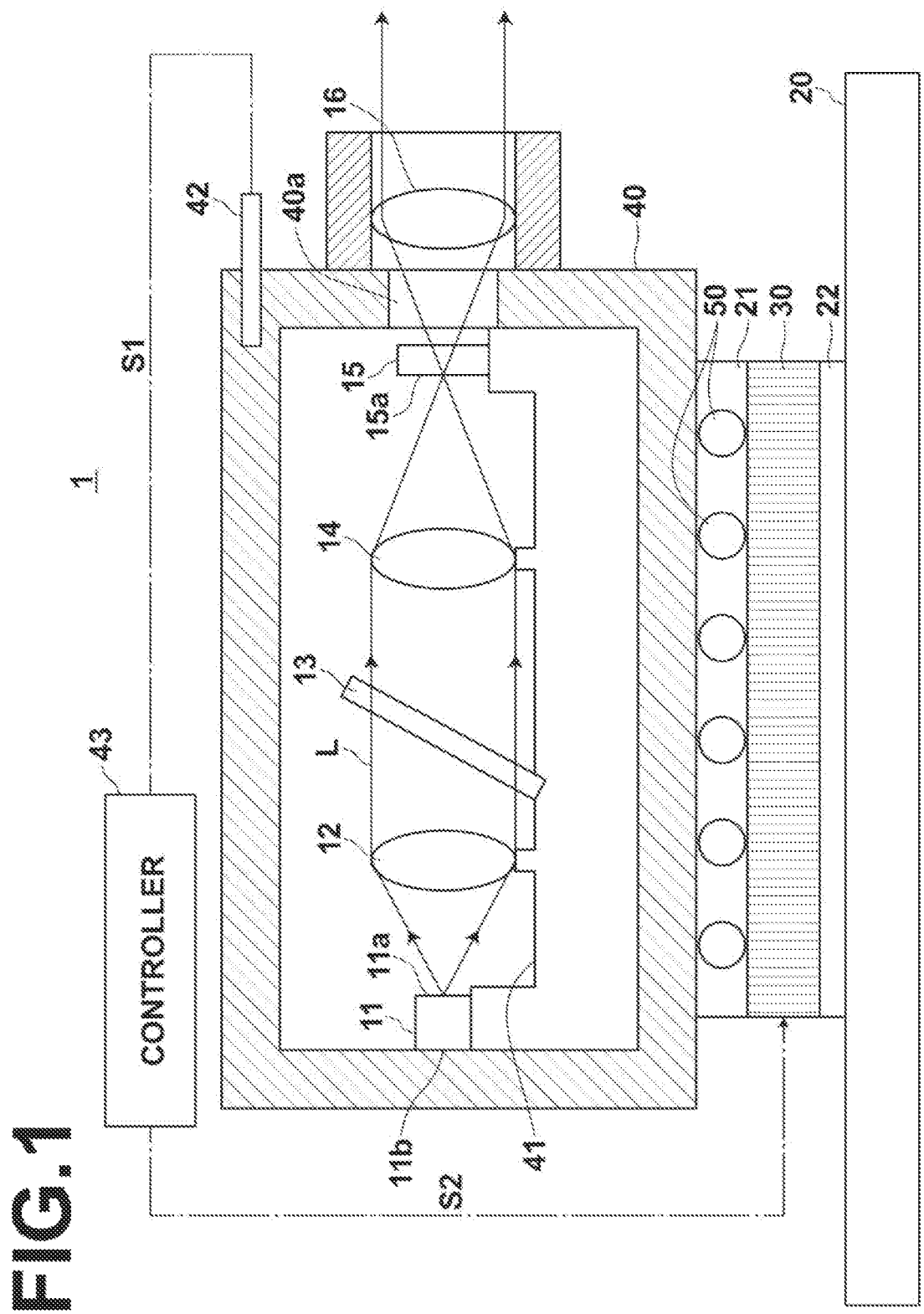
FIG. 1 is a partial cross sectional side view that illustrates a laser apparatus according to a first embodiment of the present disclosure.
Figure 2:
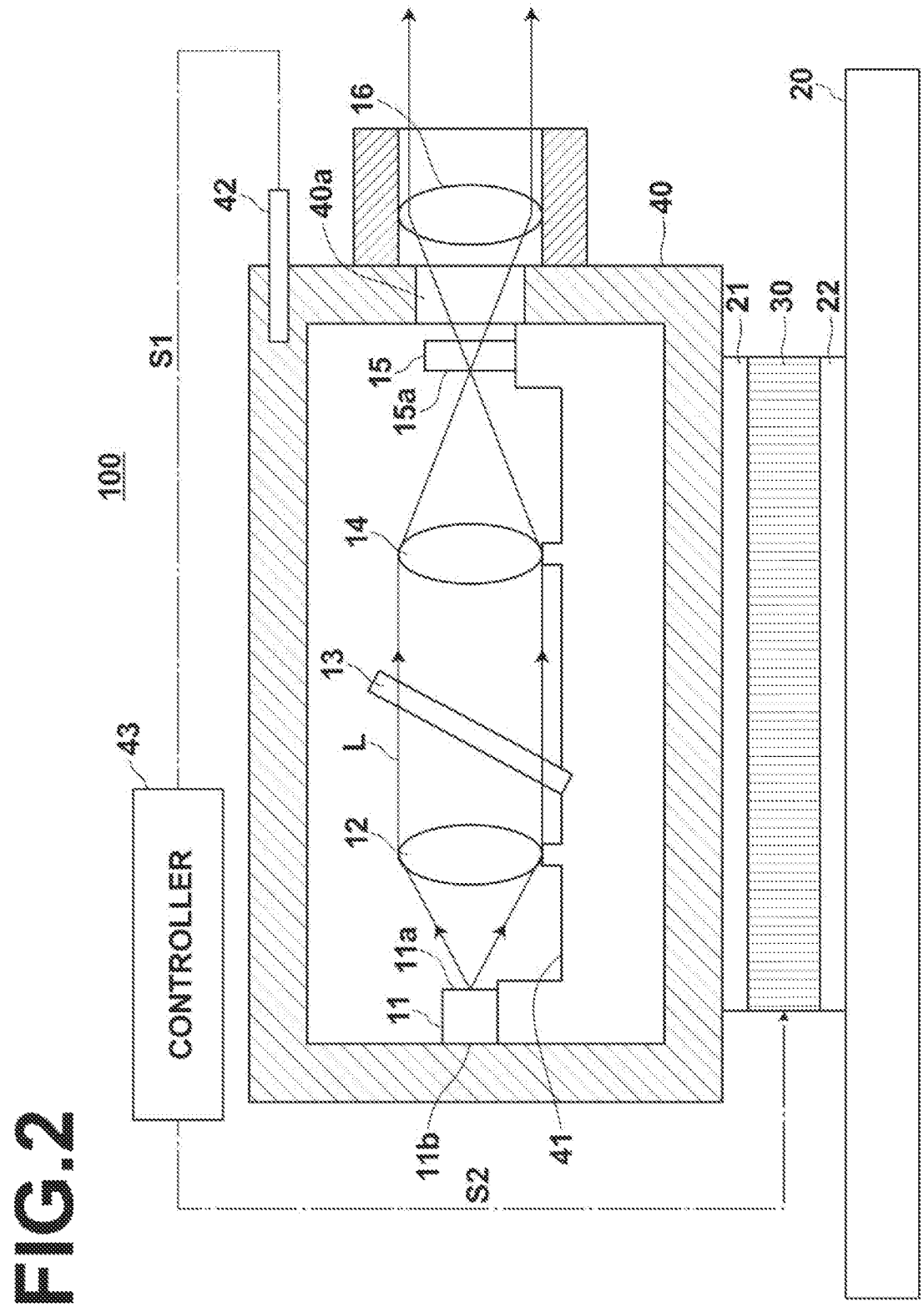
FIG. 2 is a partial cross sectional side view that illustrates a conventional laser apparatus.
Figure 3:
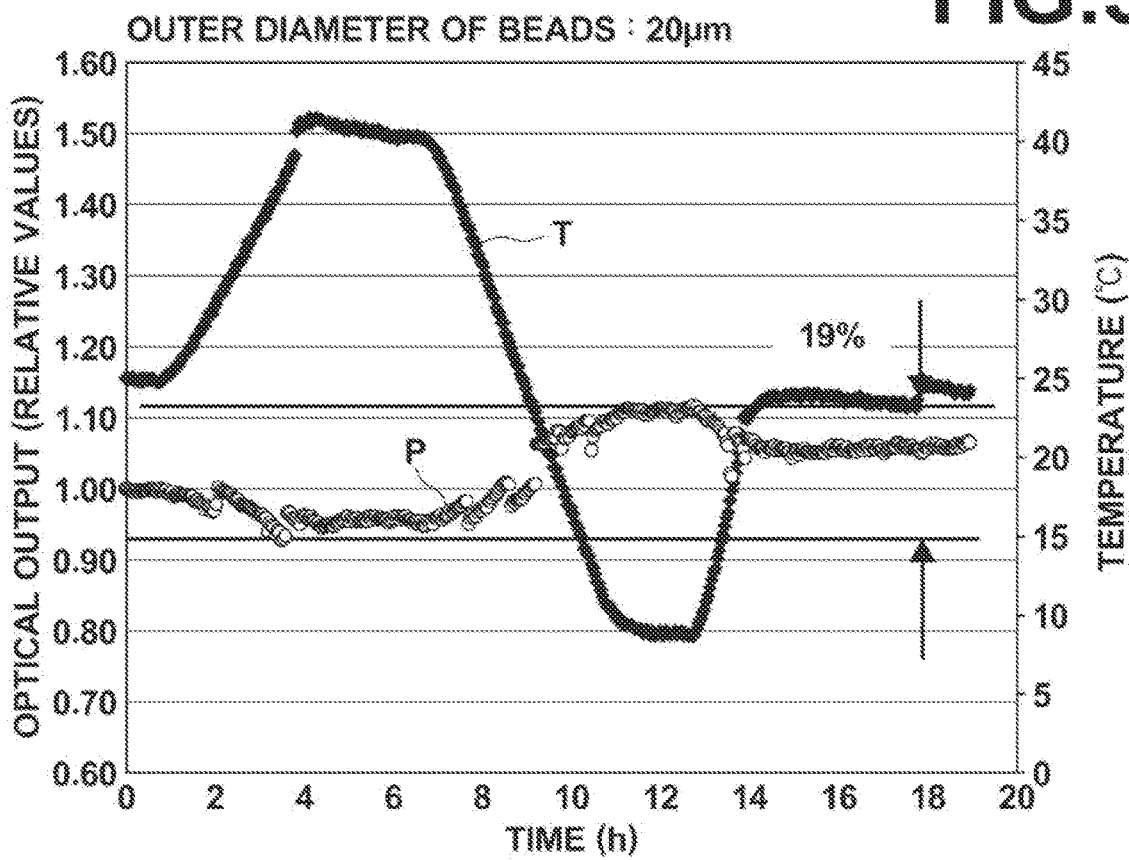
FIG. 3 is a graph that shows optical output properties for a case in which the outer diameters of spacer beads are 10 μm in the laser apparatus of FIG. 1.
Figure 4:
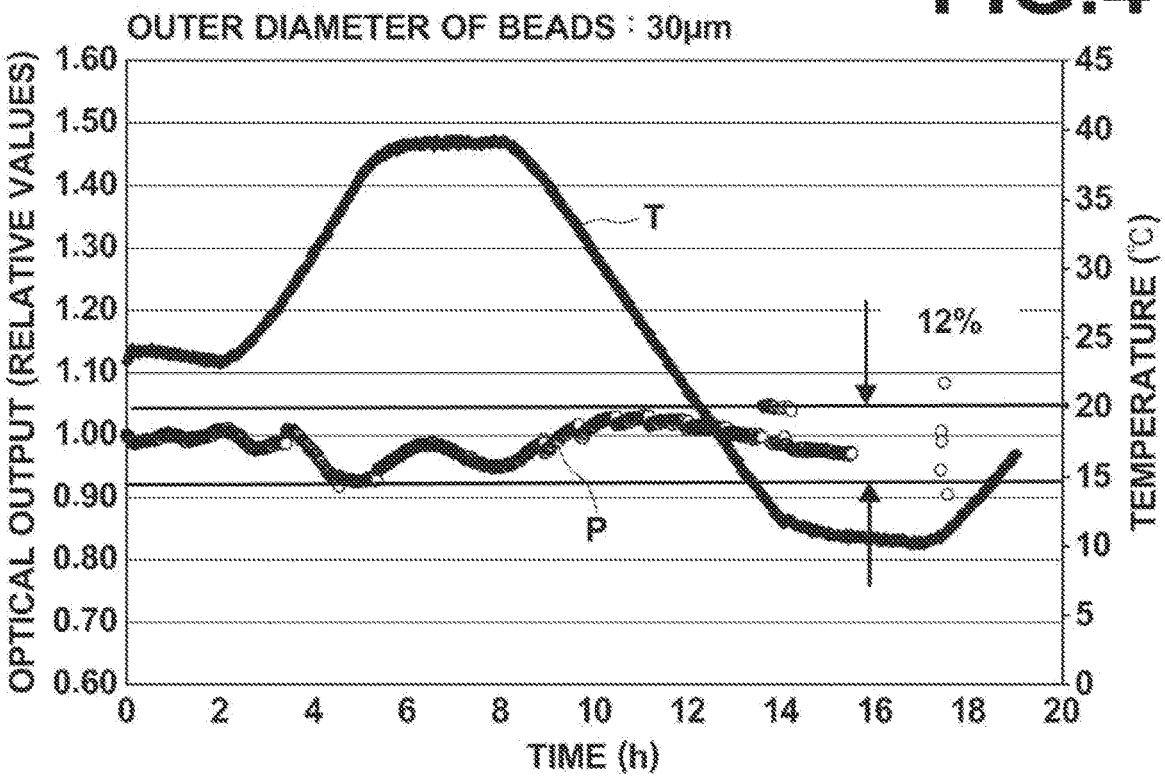
FIG. 4 is a graph that shows optical output properties for a case in which the outer diameters of spacer beads are 30 μm in the laser apparatus of FIG. 1.
Figure 5:
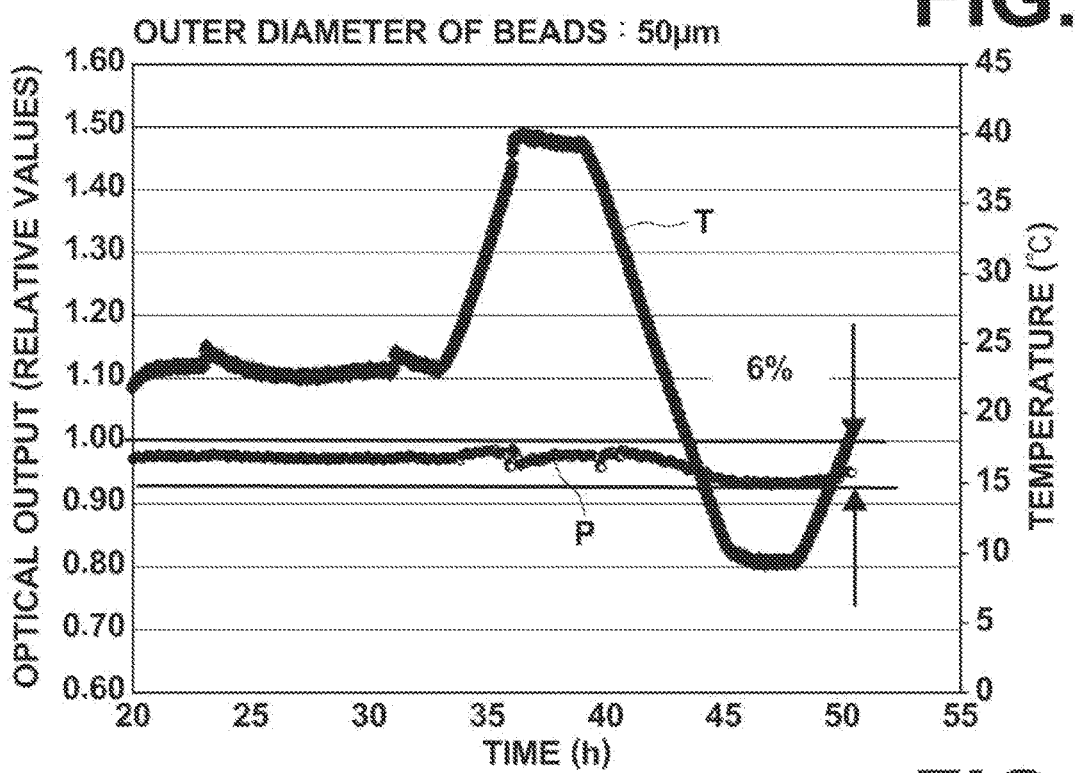
FIG. 5 is a graph that shows optical output properties for a case in which the outer diameters of spacer beads are 50 μm in the laser apparatus of FIG. 1.
Figure 6:
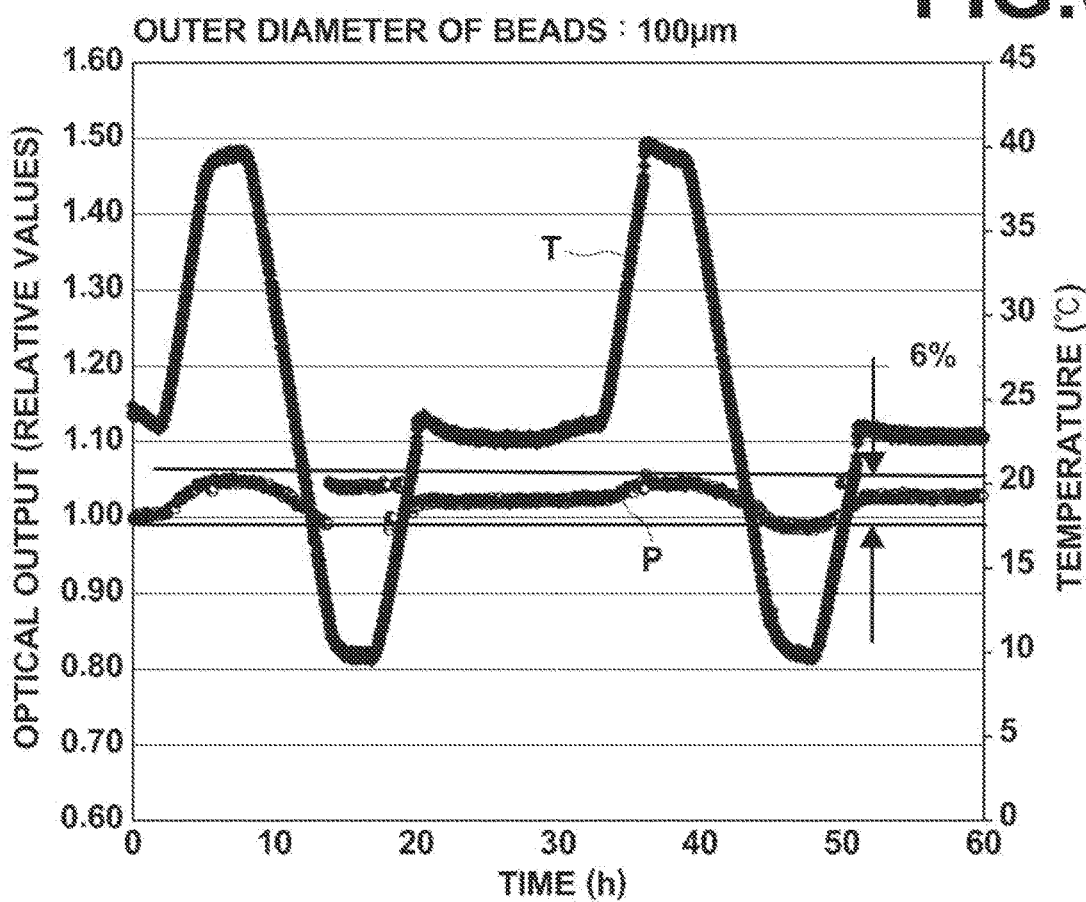
FIG. 6 is a graph that shows optical output properties for a case in which the outer diameters of spacer beads are 100 μm in the laser apparatus of FIG. 1.

Embodiments of the present disclosure will be described in detail with reference to the attached drawings below. FIG. 1 is a partial cross sectional side view that illustrates a laser apparatus 1 according to a first embodiment of the present disclosure. FIG. 2 is a partial cross sectional side view that illustrates a conventional laser apparatus 100 as an example to be compared to the laser apparatus 1. As shown in FIG. 1, the laser apparatus 1 includes a base plate 20 which is constituted by a metal plate, for example, a Peltier element 30 which is bonded to the base plate 20 via a thermally conductive adhesive layer 22, and a box shaped housing 40 which is bonded to the Peltier element 30 via a thermally conductive adhesive layer 21. In FIG. 1 and FIG. 2, the housing 40 is illustrated in cross section, and constituent components of lasers which are contained therein are clearly illustrated.

As shown in FIG. 1, a window through which light exits is formed on a front side surface (the right side surface in the drawings) of the housing 40, and a light transmitting member 40a constituted by a transparent member is fitted into this window. A mount 41 is fixed in the interior of the housing 40, and the constituent components of the lasers are held on the mount 41. That is, a laser diode 11 (hereinafter referred to as LD 11), a collimating lens 12, a band pass filter 13 (hereinafter referred to as BPF 13), a focusing lens 14, and a resonator mirror 15 are arranged and fixed on the mount 41 in this order from the left side to the right side in the drawings. A collimating lens 16 is held at the exterior of the housing 40 at a position that faces the light transmitting member 40a.

Light L which is emitted from a front end edge surface 11a of the LD 11 is collimated by the collimating lens 12, passes through the BPF 13, is focused by the focusing lens 14, and converges on a back end surface 15a of the resonator mirror 15. The LD 11 is constituted by a GaN substrate, for example, that does not oscillate itself. However, a highly reflective coating (having a reflectance of 99%, for example) is administered on a back side surface 11b of the LD 11, and a coating that reflects the light L at a comparatively high reflectance (a reflectance of 65%, for example) is administered on the back end surface 15a of the resonator mirror 15. Thereby, the light L oscillates, and a high-power laser beam is obtained. That is, in the present embodiment, the back end surface 11b of the LD 11 and the back end surface 15a of the resonator mirror 15 constitute an external resonator.

The wavelength of the oscillated laser beam L is selected by the BPF 13, and an oscillating wavelength is set to 488 nm. The transmittable bandwidth of the BPF 13 is approximately 0.5 nm or 1.0 nm, for example, thereby the laser beam L becomes an extremely narrow band laser beam. In this manner, even if the oscillating mode is the longitudinal single mode, for example, and a driving current is further increased or decreased, a stable narrow band having a range of oscillation wavelength fluctuation of less than or equal to 0.01 nm can be obtained.

Normally, in the case that an outer resonator configuration is not provided, the longitudinal mode is multimode, and the range of oscillation wavelength fluctuation is several nm, which is great. Therefore, the range of applicable uses increases significantly by providing the outer resonator configuration. This laser beam L passes through the resonator mirror 15 (having a transmittance of 35%, for example) and the light transmitting member 40a, is collimated by the collimating lens 16 thereafter, and then applied to a predetermined use.

A thermistor 42 that detects the temperature of the housing 40 is incorporated in the housing 40. Temperature detection signals S1 which are output by the thermistor 42 are input to a controller 43 (temperature adjustment control circuit). The controller 43 outputs drive control signals S2 that control driving of the Peltier element 30 which is the temperature adjusting element. The drive control signals S2 basically cause the bonding surface of the Peltier element 30 (the upper surface in FIG. 1) to be heated in the case that a detected temperature represented by the temperature detection signals S1 is lower than a predetermined temperature (36° C., for example), and conversely cause the bonding surface to be cooled in the case that a detected temperature is higher than the predetermined temperature. By the driving of the Peltier element 30 being controlled in this manner, the temperature of the housing 40 is set to the predetermined temperature. Thereby, the length of the resonator within the housing 40 is maintained at a predetermined length, and fluctuations in optical output of the laser beam L due to changes in the resonator length are prevented.

Here, the laser apparatus 1 described above according to the present disclosure, will be compared with the conventional laser apparatus 100 illustrated in FIG. 2 as a comparative example. The basic difference between these laser apparatuses is that in the conventional laser apparatus 100, the Peltier element 30 and the housing 40 are bonded via a relatively thin adhesive layer 21 with a thickness of about 5 μm to 10 μm, whereas in the laser apparatus 1 according to the present disclosure, an adhesive layer 21 in which a plurality of substantially uniformly shaped spacers 50 are dispersed is employed. In the laser apparatus 1, according to the present disclosure, the above spacers 50 are dispersed so that the distance between the housing 40 and the Peltier element 30 is uniform and relatively large (about 10 μm to 100 μm as an example).

In the present embodiment, the spacers 50 are more specifically ceramic spherical beads constituted by silicon dioxide. However, the spherical beads 50 may be constituted by other ceramics, and further beads constituted by zirconia, alumina, or glass are also applicable. Generally, beads formed by an inorganic material having a high degree of hardness, a low amount of impurities, and high stability may be favorably employed.

In order to uniformly regulate the distance between the housing 40 and the Peltier element 30 as described previously, it is desirable for the outer diameters of the plurality of beads 50 to not have variations, or for the variations to be slight. It is possible to produce the beads 50 which are constituted by the materials described above to be produced such that a margin of error is within ±10%, and therefore the aforementioned materials are preferable for regulating the distance to be uniform. However, three are no practical problems with respect to preventing fluctuations in optical output of the laser beam L and maintaining the responsive properties of the housing 40 to temperature adjustments high, even if the margin of error in the outer diameters of the beads 50 is approximately ±50%.

In the present embodiment, an adhesive layer constituted by a silicone series thermally conductive adhesive agent is employed as the adhesive layer 21 in which the beads 50 are dispersed, from the viewpoint of favorable thermal responsivity. However, the adhesive agent to be employed in the present disclosure is not limited to a silicone series adhesive agent, and although thermal responsivity is not as favorable, organic adhesive agents such as epoxy series adhesive agents and cyanoacrylic series adhesive agents may be employed.

In the present embodiment, after the beads 50 are dispersed in the adhesive agent, the adhesive agent is coated on the bonding surface of the Peltier element 30 to form the adhesive layer 21. It is possible to form the adhesive layer 21 in which the beads 50 are dispersed by other methods as well. For example, the plurality of beads 50 may be scattered on the bonding surface of the Peltier element 30 in advance, and the adhesive agent may be coated thereon by a dispenser to form the adhesive layer 21 in which the beads 50 are dispersed.

If approximately a 1% weight ratio of the amount of the beads 50 to be dispersed with respect to the amount of the adhesive agent is secured, such an amount is sufficient in order to obtain the advantageous effects of the present disclosure to be described later. However, if the amount of the beads 50 which are dispersed is excessively low, the beads 50 will become embedded in recesses and protrusions in the metals that constitute the housing 40 and the bonding surface of the Peltier element 30, and the advantageous effects of the present disclosure may not be sufficiently obtained. Therefore, it is desirable for the total number of the beads 50 to be greater than or equal to approximately several 10's. The above point will be described in detail below.

If the surface precisions of the bonding surfaces of each of the Peltier element 30 and the housing 40 are extremely favorable without recesses and protrusions in the same manner as glass, the distance between the Peltier element 30 and the housing 40 can be a certain value (the same value as the outer diameter of the beads 50) if there are at least three beads per each surface. If only one or two beads 50 are provided, the Peltier element 30 and the housing 40 will become inclined with respect to each other. However, if three beads 50 are provided, there will be no inclination, and a number of beads 50 exceeding three will be wasteful. The above is a judgment based on a geometric viewpoint assuming that each of the bonding surfaces are ideal surfaces. However, circumstances will differ if the actual surface precision of each of the bonding surfaces is taken into consideration.

That is, each of the bonding surfaces are normally a metal surface, and generally, tooling marks having dimensions within a range from several μm to several 10's of μm are present on such metal surfaces. For this reason, if one of the beads 50 out of the three becomes embedded in a tooling mark, the distance between the Peltier element 30 and the housing 40 will be in the same state as a case in which two beads 50 are provided. In order to realize a desired state with respect to the distance even if several beads 50 are embedded in tooling marks in this manner, a number of beads exceeding three will be necessary. From this viewpoint, the present inventors calculated a favorable amount of the beads 50 to be dispersed with respect to the amount of the adhesive agent, and it was found that an approximately a 1% weight ratio was sufficient to realize the above desired state. It was also found that if a large number of beads 50 were dispersed, for example, a weight ratio of greater than or equal to 30%, an inherent adhesive function of the adhesive layer 21 will deteriorate. Therefore, it is desirable for the aforementioned weight ratio to be approximately 1%.

Temperature adjusting elements other than the Peltier element 30 may be employed. An example of such an applicable temperature adjusting element is an electrically driven heater which does not have a cooling function.

The advantageous effect which is exhibited by the laser apparatus 1 of the present embodiment having the configuration described above will be explained. In the laser apparatus 1, the adhesive layer 21 in which the plurality of substantially uniformly shaped beads 50 that regulate the distance between housing 40 and the Peltier element 30 are dispersed is employed as the adhesive layer 21. Therefore, it is possible for the thickness of the adhesive layer 21 to be comparatively thick, while enabling this thickness to be controlled to be uniform. Thereby, deformation of the Peltier element 30 itself due to changes in temperature can be caused to be difficult to be transferred to the housing 40. Thereby, deformation of the housing 40, that is, changes in the length of the resonator, can be prevented, and it becomes possible to prevent fluctuations in optical output of the laser apparatus 1.

Next, the results of actual measurements of optical output fluctuations in the laser apparatus 1 of the present embodiment will be described. Here, four laser apparatuses 1, in which the outer diameters of the beads 50 were set to 20 μm, 30 μm, 50 μm, and 100 μm (that is, the distance between the housing 40 and the Peltier element 30 is each of these values) were prepared as samples, and optical output fluctuations of laser beams L were measured when the ambient temperature of each sample was changed within a range from 10° C. to 40° C.

The results of the measurements of optical output fluctuations are shown in the graphs of FIG. 3 through FIG. 6. Measurement results for cases in which the outer diameter of the beads 50 were 20 μm, 30 μm, 50 μm, and 100 μm are shown in order in FIG. 3, FIG. 4, FIG. 5, and FIG. 6. In these graphs, "TIME (h)" of the horizontal axis represents elapsed times from the points in time at which driving of the laser apparatuses 1 were initiated (hours as units), the right vertical axis represents the ambient temperatures of the laser apparatuses 1 (° C. as units), and the left vertical axis represents the optical output of the laser beams L (relative values). For each sample, the temperature (° C.) and optical output (relative value) were measured at each of a plurality of elapsed times (h). In each of the graphs, the measured values for temperature (° C.) are plotted as squares and the measured values for optical output (relative values) are plotted as circles. The letter "T" denotes the collection of the former plots, and the letter "P" denotes the collection of the latter plots, in order to facilitate discrimination between the two.

During these measurements, the LD 11 was driven with a constant driving current (150 mA, as an example). Because the driving current is constant, it can be understood that optical output fluctuations are due to changes in resonator length caused by deformation of the housing 40 which is transferred from deformation of the Peltier element 30 according to changes in ambient temperature.

Figure 7:
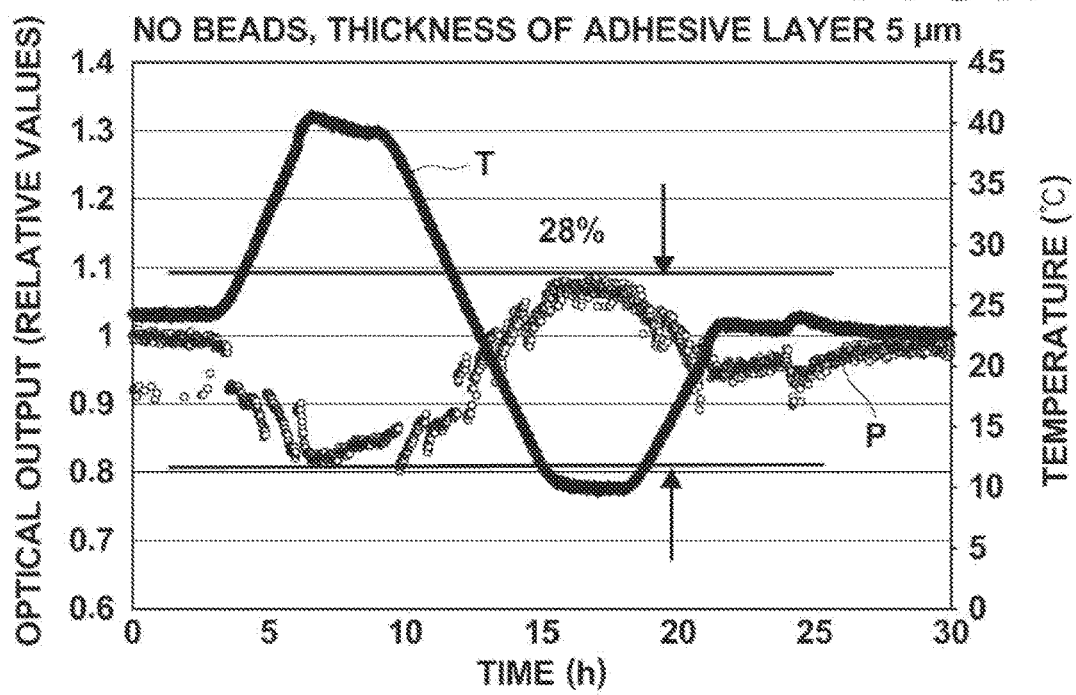
FIG. 7 is a graph that shows an example of optical output properties in a conventional laser apparatus.
Figure 8A:
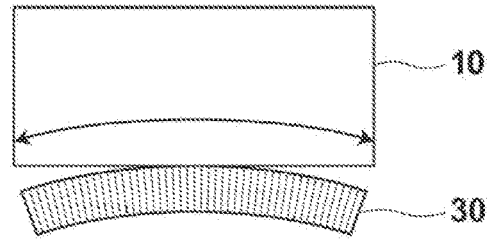
FIG. 8A is a schematic diagram for explaining the problems of a conventional laser apparatus.
Figure 8B:
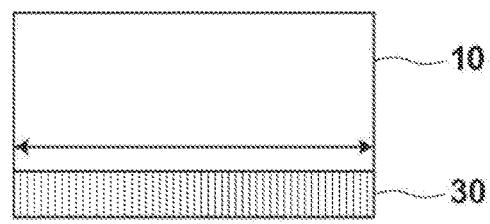
FIG. 8B is a schematic diagram for explaining the problems of a conventional laser apparatus.
Figure 8C:
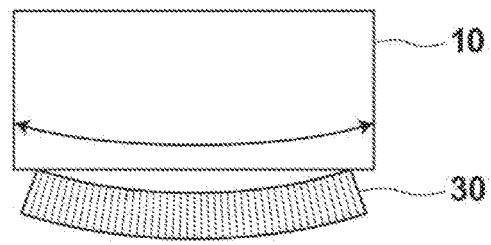
FIG. 8C is a schematic diagram for explaining the problems of a conventional laser apparatus.

In order to conduct a comparison with these measurement results, the same measurements were conducted for the conventional laser apparatus illustrated in FIG. 2, and the results are shown in the graph of FIG. 7. The conventional laser apparatus as this comparative example is that in which an adhesive layer 21 does not contain beads and has a thickness of 5 μm. The manner in which the measurement results are shown in FIG. 7 is the same as those for FIG. 3 through FIG. 6.

The amounts of fluctuation in optical output (indicated as percentages) with respect to the values when measurements were initiated shown in the graphs of FIG. 3 through FIG. 6 are 19%, 12%, 6%, and 6% for cases in which the outer diameters of the beads 50 were 20 μm, 30 μm, 50 μm, and 100 μm, respectively. These amounts of fluctuation are significantly less than the 28% shown in FIG. 7 for the conventional laser apparatus, which confirms the advantageous effect exhibited by the present disclosure.

Figure 9:
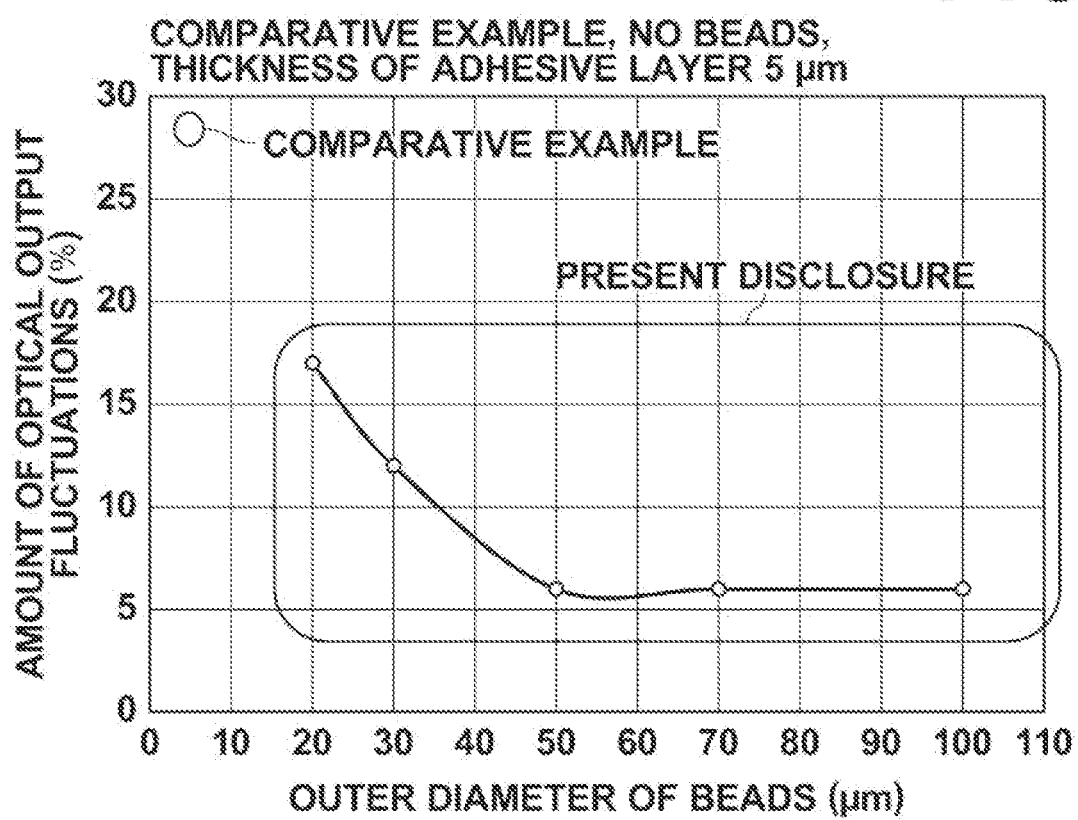
FIG. 9 is a graph that shows the relationship between the outer diameters of the beads and the amounts of optical output fluctuation of laser apparatuses.

FIG. 9 is a graph that shows the amounts of optical output fluctuations for cases in which the outer diameters of the beads 50 are 20 μm, 30 μm, 50 μm, 70 μm, and 100 μm in the laser apparatus 1 of the present embodiment together with the amount of optical output fluctuation shown in FIG. 7 for the conventional laser apparatus. As is shown in FIG. 9, the amounts of optical output fluctuation are saturated when the outer diameters of the beads 50 are within a range from 50 μm to 100 μm. Accordingly, it can be said that setting the outer diameter of the beads 50 to be greater than 50 μm is not particularly effective from the viewpoint of suppressing fluctuations in optical output.

Meanwhile, the rate of thermal conductivity of the adhesive layer 21 is generally lower than that of metals. Therefore, the thermal response time during temperature adjustment of the housing 40 will become slower the greater the thickness of the adhesive layer 21 is. Therefore, it can be said that it is generally desirable for the outer diameter of the beads 50 to be set to approximately 50 μm in order to shorten the thermal response time and to suppress fluctuations in optical output. However, there are many other factors that determine thermal response time, such as the mounting position of the thermistor 42, the heat capacity of the housing 40, the bonding surface area between the housing 40 and the Peltier element 30, etc., in addition to the thickness of the adhesive layer 21. The conditions under which the measurement results of FIG. 9 were obtained, that is, with a set temperature of 36° C. and the outer diameters of the beads 50 being within a range from 20 μm to 100 μm, the amount of time required to reach the set temperature (36° C.) from room temperature (22° C.) was less than or equal to two minutes in all of the measurements, and the differences in these amounts of time was within a range of variation. Accordingly, it was understood that the outer diameter of the beads 50 may be any within a range from 50 μm to 100 μm, even if the thermal response time is taken into consideration.

Figure 10:
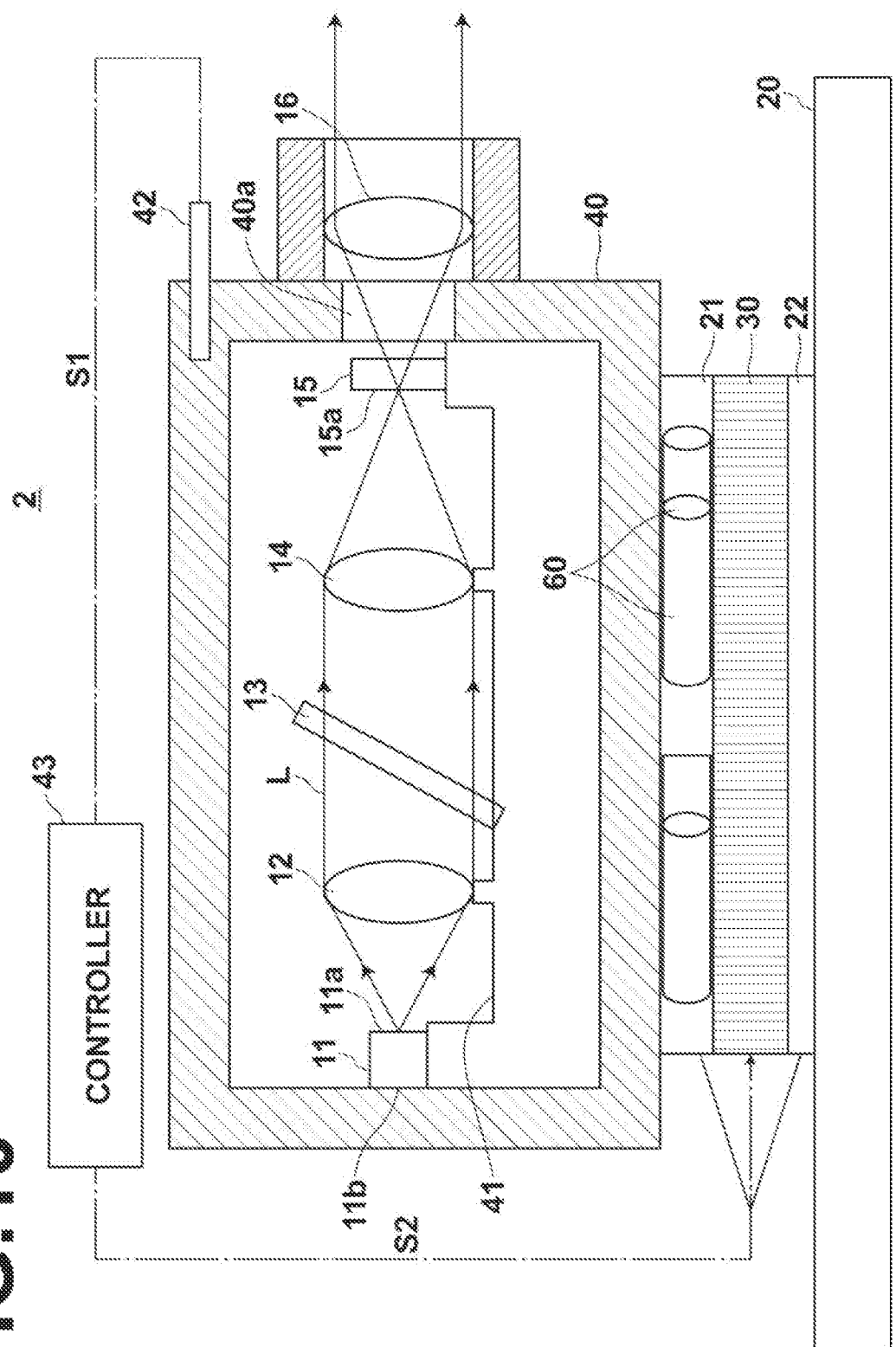
FIG. 10 is a partial cross sectional side view that illustrates a laser apparatus according to a second embodiment of the present disclosure.
Figure 11:
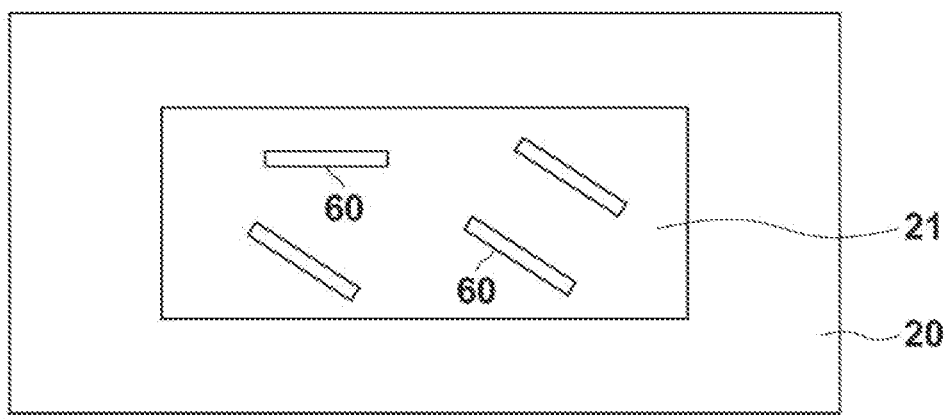
FIG. 11 is a plan view that illustrates a portion of the laser apparatus of FIG. 10.

Next, a laser apparatus 2 according to a second embodiment of the present disclosure will be described with reference to FIG. 10 and FIG. 11. In FIG. 10 and FIG. 11, elements which are equivalent to those within FIG. 1 described previously are denoted with the same reference numerals, and descriptions thereof will be omitted insofar as they are not particularly necessary (the same applies hereafter).

The laser apparatus 2 differs from the laser apparatus 1 of the first embodiment illustrated in FIG. 1 in the point that a plurality of cylindrical fibers 60 are dispersed within the adhesive layer 21 as spacers instead of the spherical beads 50. The plurality of fibers 60 have uniform lengths of 1 mm, for example, and uniform outer diameters of 120 μm, for example. The state in which the plurality of fibers 60 are arranged along the adhesive layer 21 is illustrated in FIG. 11. By the plurality of fibers 60 being dispersed in the adhesive layer 21 in this manner, the distance between the housing 40 and the Peltier element 30 is regulated to be a uniform 120 μm.

The amount of fluctuation in optical output was determined for the laser apparatus 2 having the above configuration, and it was found that the amount of fluctuation was suppressed to 6%. Therefore, it was confirmed that the laser apparatus 2 exhibited the same advantageous effect as that exhibited by the laser apparatus 1 of the first embodiment.

Note that fibers 60 having lengths other than 1 mm may be employed. The outer diameters of the fibers 60 are also not limited to 120 μm, and an appropriate outer diameter may be selected according to a distance between the housing 40 and the Peltier element 30 to be regulated.

Next, a laser apparatus 3 according to a third embodiment of the present disclosure will be described with reference to FIG. 12. The laser apparatus 3 differs from the laser apparatus 1 of the first embodiment illustrated in FIG. 1 in the point that the laser which is contained within the housing 40 is not an external resonator type laser, but a laser diode pumped solid state laser. The laser diode pumped solid state laser is of a configuration equipped with the LD 11 that emits a laser beam L1 as pumping light, a focusing lens 70 that converges the laser beam L1 that diffuses, an Nd:YAG crystal 71 provided at a position at which the laser beam L1 converges, and a resonator mirror 72 provided forward of the Nd:YAG crystal 71.

The LD 11 is that which emits a laser beam L1 having a wavelength of 808 mm. The Nd:YAG crystal 71 is a solid state laser medium which is doped with neodymium (Nd) that emits light L having a wavelength of 946 nm by being pumped by the laser beam L1. This light L resonates between a back end surface 71a of the Nd:YAG crystal 71, on which an appropriate coating is administered, and a mirror surface 72a of the resonator mirror 72, to cause laser oscillation to occur. A laser beam L having a wavelength of 946 nm which is obtained in this manner passes through the light transmitting member 40a, exits to the exterior of the housing 40, and then is applied to a predetermined use.

The laser apparatus 3 having the above configuration also exhibits basically the same advantageous effects as those exhibited by the laser apparatus 1 because the adhesive layer 21 in which the plurality of spherical beads 50 are dispersed is employed.

Figure 12:
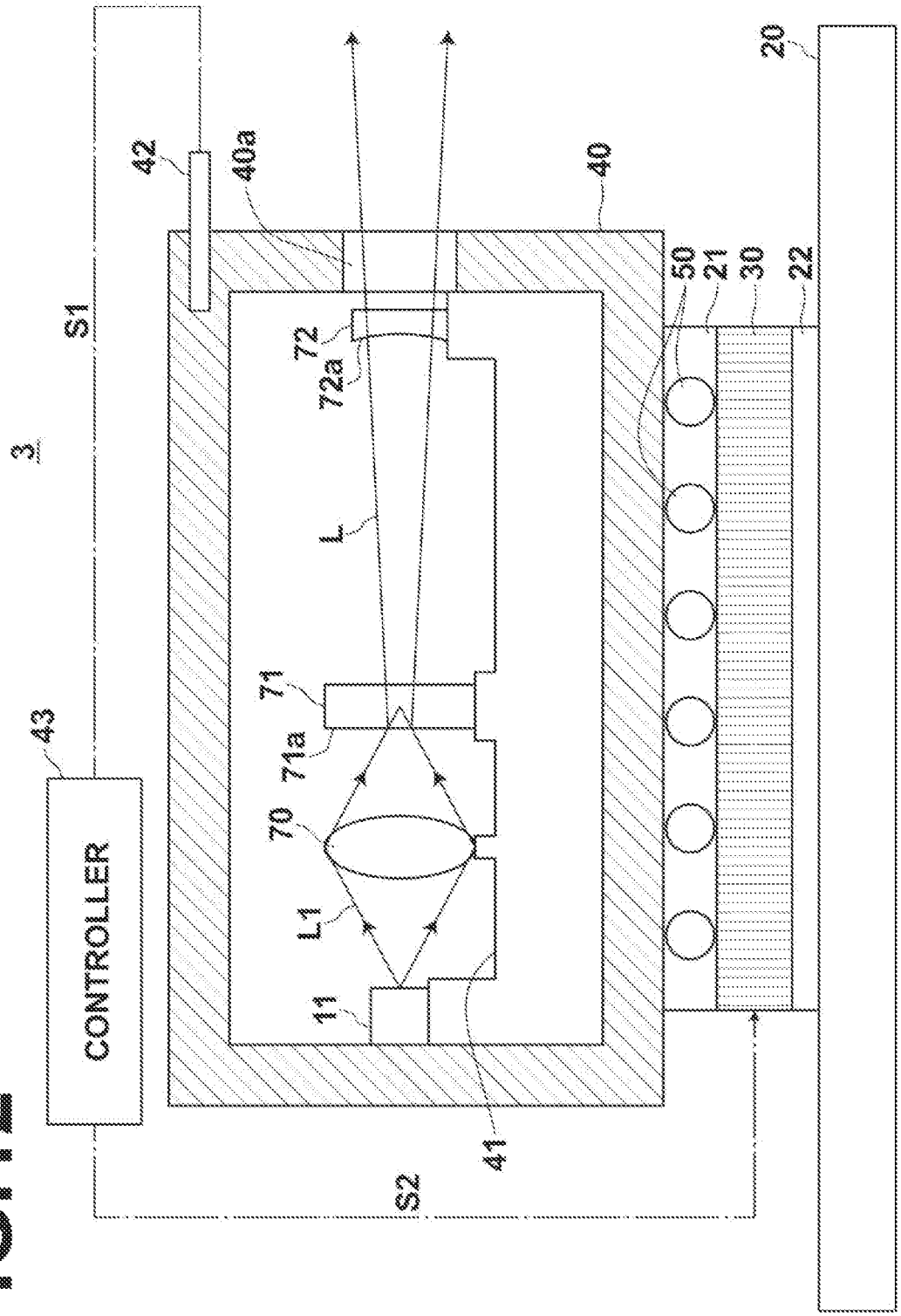
FIG. 12 is a partial cross sectional side view that illustrates a laser apparatus according to a third embodiment of the present disclosure.

In the laser diode pumped solid state laser illustrated in FIG. 12, if a non-linear optical crystal, for example, LBO ($LiB_3O_5$: lithium triborate) is provided between the Nd:YAG crystal 71 and the resonator mirror 72, blue light having a wavelength of 473 nm, which is a second harmonic, can be obtained. Various laser apparatuses such as laser diode pumped solid state lasers that perform wavelength conversion (wavelength shortening) in this manner are known, and the present disclosure may also be applied to these types of laser apparatuses as well.

What is claimed is:
1. A laser apparatus comprising:
   a housing, within which constituent components of a laser that include a resonator and a laser diode which emits laser light toward the resonator are contained;
   a temperature adjusting element which is bonded to the housing via an adhesive layer; and
   the temperature adjusting element being driven based on a detected temperature of the housing to adjust the temperature of the housing to be a predetermined temperature;

wherein the adhesive layer being that in which a plurality of substantially uniformly shaped spacers that regulate a distance between the housing and the temperature adjusting element are dispersed, the spacers being constituted by one of a glass and a ceramic.

2. The laser apparatus according to claim 1, wherein: the spacers are spherical beads.

3. The laser apparatus according to claim 2, wherein: the outer diameters of the beads are within a range from 10 μm to 100 μm.

4. The laser apparatus according to claim 1, wherein: the spacers are cylindrical fibers.

5. The laser apparatus according to claim 1, wherein: the laser which is contained within the housing is an external resonator type laser.

6. The laser apparatus according to claim 1, wherein: the laser which is contained within the housing is a laser diode pumped solid state laser.

7. The laser apparatus according to claim 1, wherein: the laser which is contained within the housing comprises a wavelength controlling element that causes an oscillating wavelength to become a narrow band wavelength.

8. The laser apparatus according to claim 1, further comprising a mount fixed in an interior of the housing, wherein the constituent components of the laser are held on the mound.

9. The laser apparatus according to claim 1, wherein the constituent components of the laser include: the laser diode; a collimating lens; a bandpass filter; a focusing lens; and a resonator mirror.

\* \* \* \* \*